US006173760B1

(12) United States Patent
Gardell et al.

(10) Patent No.: US 6,173,760 B1
(45) Date of Patent: Jan. 16, 2001

(54) CO-AXIAL BELLOWS LIQUID HEATSINK FOR HIGH POWER MODULE TEST

(75) Inventors: David L. Gardell, Fairfax, VT (US); Krisztian Gaspar, Fort Plain, NY (US); Guy C. Morin, Essex Junction, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/128,699

(22) Filed: Aug. 4, 1998

(51) Int. Cl.[7] .................................................. F28F 7/00

(52) U.S. Cl. .................................. 165/80.4; 165/104.33; 165/185; 361/385; 257/714

(58) Field of Search .................................. 165/80.4, 185, 165/104.33; 361/385, 699; 257/714

(56) References Cited

U.S. PATENT DOCUMENTS

| | | | | |
|---|---|---|---|---|
| 4,561,040 | * | 12/1985 | Eastman et al. | 165/80.4 |
| 4,686,606 | * | 8/1987 | Yamada et al. | 361/385 |
| 4,729,060 | * | 3/1988 | Yamamoto et al. | 361/385 |
| 4,740,866 | * | 4/1988 | Kajiwara et al. | 165/80.4 |
| 4,759,403 | * | 7/1988 | Flint et al. | 361/385 |
| 4,794,981 | * | 1/1989 | Mizuno | 165/80.4 |
| 4,910,642 | | 3/1990 | Downing . | |
| 4,920,574 | * | 4/1990 | Yamamoto et al. | 361/385 |
| 4,951,740 | * | 8/1990 | Peterson et al. | 165/80.4 |
| 4,977,444 | * | 12/1990 | Nakajima et al. | 165/80.4 |
| 5,029,638 | | 7/1991 | Valenzuela . | |
| 5,070,936 | | 12/1991 | Carroll et al. . | |
| 5,145,001 | | 9/1992 | Valenzuela . | |
| 5,294,830 | * | 3/1994 | Young et al. | 165/80.4 |
| 5,537,291 | * | 7/1996 | Onodera et al. | 165/80.4 |

* cited by examiner

*Primary Examiner*—Ira S. Lazarus
*Assistant Examiner*—Terrell McKinnon
(74) *Attorney, Agent, or Firm*—Pollock, Vande Sande & Amernick, R.L.L.P.

(57) ABSTRACT

A system for controlling the temperature an electronic component. The system includes a block for temporarily engaging a surface of the component. The block includes channels for circulating a temperature controlling fluid to control a temperature the block and the attached component.

28 Claims, 3 Drawing Sheets

47 45 13 27 39 1 43 41 37 33 29 28 31 11 43

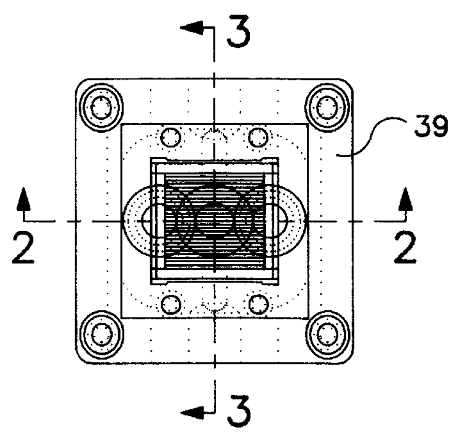
FIG. 1
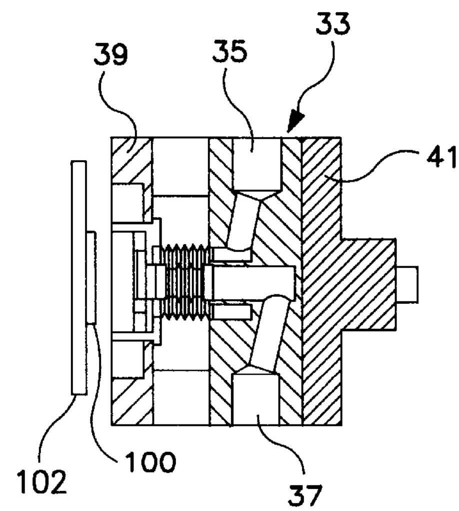
FIG. 3
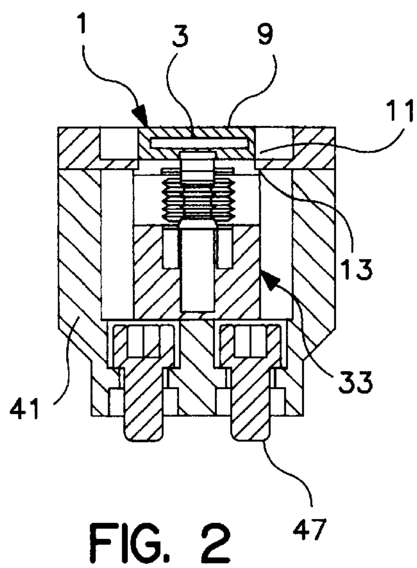
FIG. 2
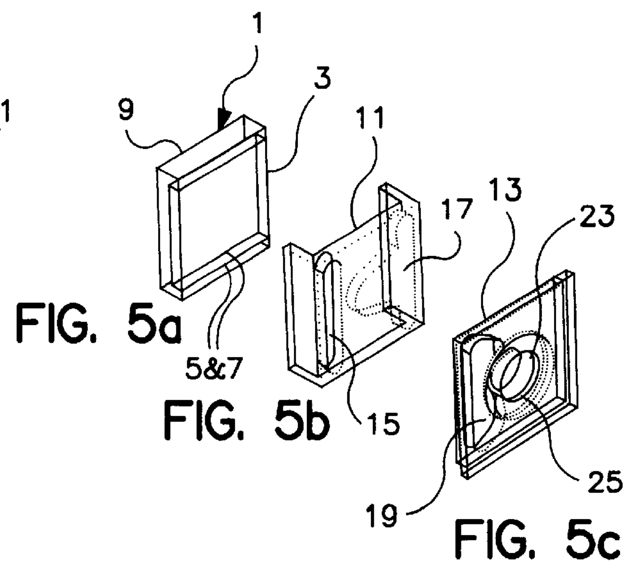
FIG. 5a
FIG. 5b
FIG. 5c

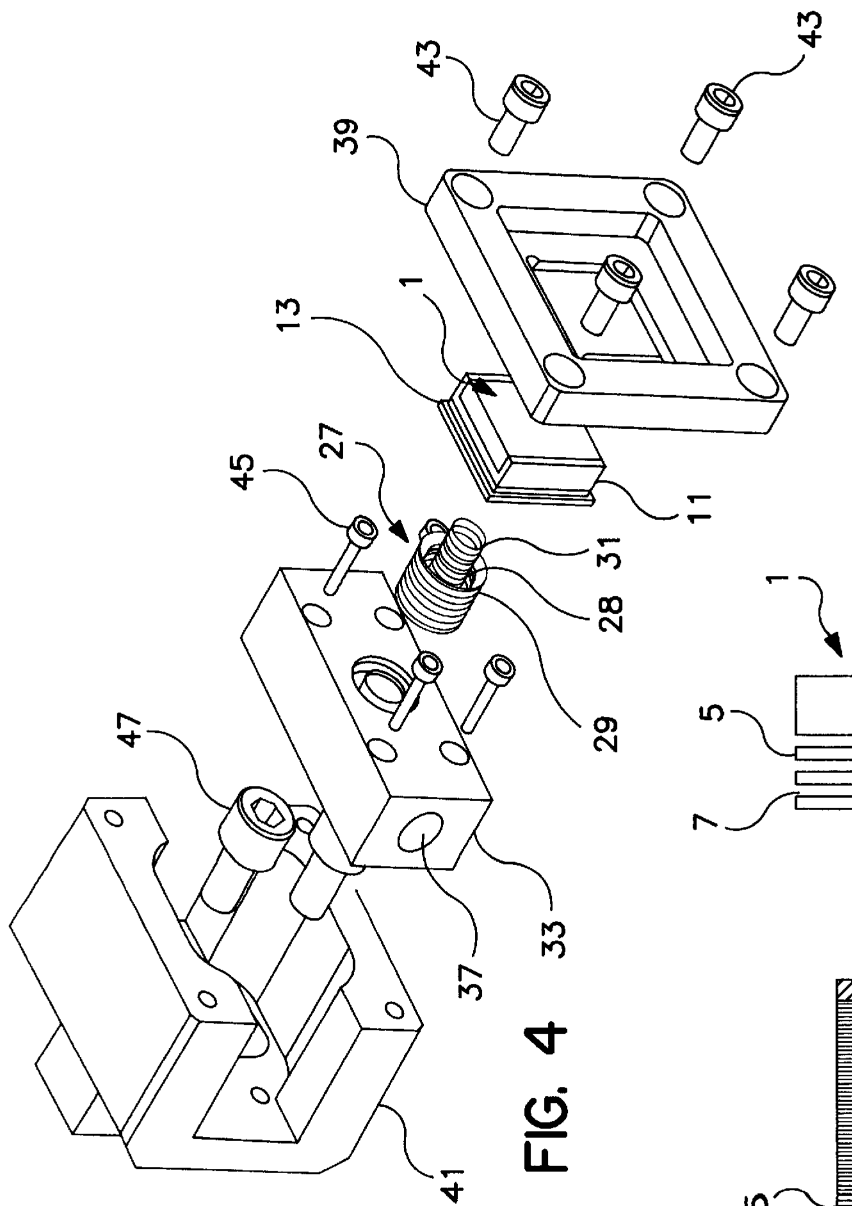
FIG. 4
FIG. 6a
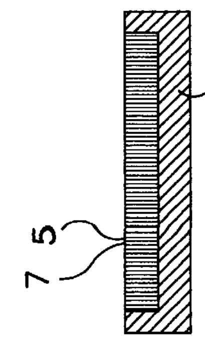
FIG. 6

CO-AXIAL BELLOWS LIQUID HEATSINK FOR HIGH POWER MODULE TEST

FIELD OF THE INVENTION

The invention relates to an apparatus utilized in the fabrication of semiconductor devices. In particular, the invention relates to an apparatus utilized for removing heat from semiconductor chips during certain aspects of semiconductor device manufacture and testing.

BACKGROUND OF THE INVENTION

During manufacture of electronic devices individual semiconductor chips are typically attached to a substrate to create an electronic module. The electronic module substrate is temporally pressed, with relatively high force, into a socket for electrical testing and burn-in. The temperature of the chip must be accurately controlled even though it may dissipate large amounts of heat. Any thermal control means must apply only light force to the relatively fragile surface of the silicon chip. Additionally, the surface of the chip is not necessarily flat, parallel or of uniform height above the surface of the substrate that it is attached to.

SUMMARY OF THE INVENTION

The invention provides a device, a system that includes the device, and a method for temperature control of semiconductor devices. Along these lines, the present invention provides a system for controlling the temperature of an electronic component, the system includes a block for temporarily engaging a surface of the electronic component. The block includes channels for circulating a temperature regulating fluid to control the temperature of the block and thus, the attached electronic component.

Additional aspects of the present invention provide a block for temporarily engaging a surface of an electronic component for controlling the temperature of the component. The block includes a component engaging surface. A plurality of channels circulate a temperature regulating fluid to control the temperature of the block and the electronic component engaged by the block. At least one inlet port conducts the temperature regulating fluid into the channels. At least one outlet port conducts the temperature regulating fluid from the channels. A first manifold conducts the temperature regulating fluid to the channels from the at least one inlet port and from the channels to the at least one outlet port.

Further aspects of the present invention provide a method for controlling the temperature of electronic components. The method includes engaging a surface of an electronic component with a surface of a block for temporarily contacting and controlling the temperature of the electronic component. A temperature regulating fluid is supplied to the block through at least one inlet port and the block. The temperature regulating fluid is circulated through cooling channels in the block to control the temperature of the block and the attached electronic component. The temperature regulating fluid is withdrawn from the block through at least one outlet port in the block. During circulation of the temperature regulating fluid, testing and or manufacturing processes maybe carried out on the electronic component.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 1 represents a top view of an embodiment of a system for controllng the temperature of an electronic component according to the present invention;

FIG. 2 represents a cross-sectional view of the embodiment illustrated in FIG. 1 along the line 2—2;

FIG. 3 represents a cross-sectional view of the embodiment illustrated in FIG. 1 taken along the line 3—3;

FIG. 4 represents an exploded view of the embodiment of the present invention illustrated in FIG. 1;

FIG. 5 represents an exploded view of an embodiment of a block and temperature regulating fluid flow manifold according to the present invention;

FIG. 6 represents a cross-sectional view of an embodiment of a temperature controlling block according to the present invention;

FIG. 6*a* represent a close-up cross-sectional view of a portion of the temperature controlling block illustrated in FIG. 6;

DETAILED DESCRIPTION OF THE INVENTION

Figure 7:
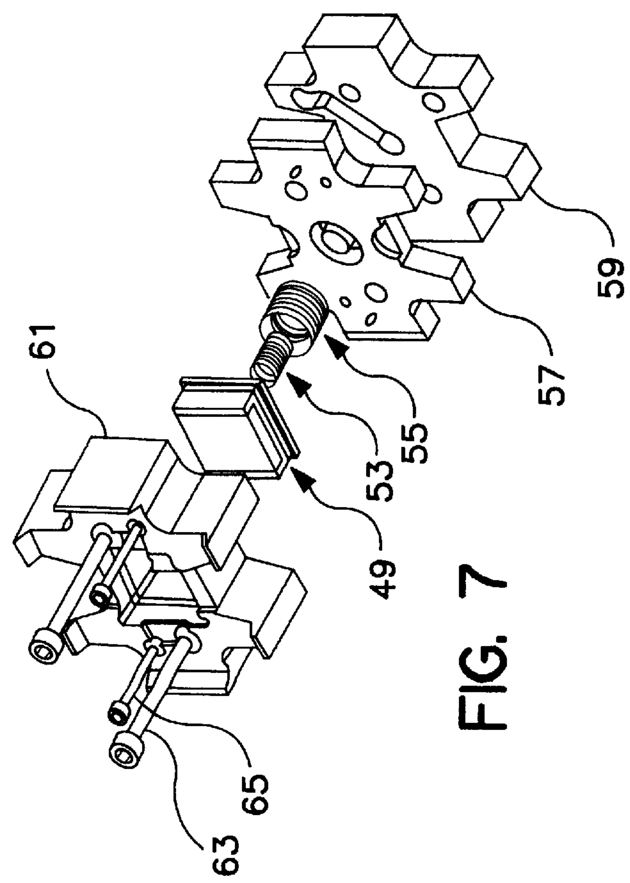
FIG. 7 represents an exploded view of another embodiment of a system for controlling the temperature of an electronic component according to the present invention.

As stated above, the present invention provides an apparatus, including a device and a system incorporating the device, and a method for controlling the temperature of electronic components during testing and/or manufacturing of the electronic components. In particular, the present invention provides an apparatus and method for controlling the temperature of semiconductor chips after they have been diced from the wafer and mounted onto a substrate and typically before any cover or heatsink is attached. Examples of the process include testing and burn-in. During burn-in, typically, an elevated temperature and/or voltage may be applied to the device to induce early life fails and thus, ensure product reliability. According to one example, the present invention is utilized for temperature control of high power micro processor chips during module test and burn-in.

According to one embodiment, the system includes a block for temporarily engaging a surface of the electronic components. The block includes channels for circulating a temperature regulating fluid to control the temperature of the block and an electronic component engaged by the block. According to one embodiment, the temperature regulating fluid is a coolant. In such an embodiment, the channels act as cooling channels. FIG. 5*a* represents an embodiment of a block 1 according to the present invention.

The cooling block includes a component engaging surface 9. Typically, the component engaging surface is planar. The component engaging surface 9 of cooling block 1 lightly contacts a chip 100 attached to substrate 102, such as a chip support, to provide temperature control.

A co-axial bellows, described below ingreater detail, may be included in the present invention to accommodate variations in planarity of the electronic component as well as height of the electronic component. The co-axial bellows permits the cooling block assembly to be effectively gimbaled to have a large compliance in Z, theta-X and theta-Y degrees of freedom. Compliance of the co-axial bellows may prevent thermal contact to the chip from being compromised by variations in height or planarity of the surface of chip 100 relative to the surface of the substrate 102.

The composition of the block may vary, depending, among other factors, upon the application. According to one embodiment, the cooling block is made of copper. According to such an embodiment, the cooling block may be made from a solid piece of copper. The cooling channels in such an embodiment may be electro discharge machined in the block of copper. According to another embodiment, the cooling block is formed from a plurality of thin copper sheets. The copper sheets may be soldered together to form the cooling block. The cooling channels may be formed by spaces between the copper sheets.

As shown in FIG. 5*a,* the cooling block 1 includes a component engaging surface 9. Opposite the component engaging surface 9, the interior of the block may include a plurality of cooling channels 7 separated by cooling fins 5. Each fin 5 separates two cooling channels 7 for permitting flow of coolant therethrough. Excellent thermal coupling is achieved because the fluid flow is through multiple small channels close to and predominately parallel to surface 9 of cooling block 1. FIG. 6 illustrates a cross-sectional view of an embodiment of a cooling block according to the present invention. FIG. 6*a* represents a close-up cross-sectional view of the cooling fins and channels.

To increase the contact area between the coolant and the cooling channels 7 and fins 5, the cooling channels may have a high length-to-width aspect ratio. For example, the length in horizontal direction shown in FIG. 6 as compared to the vertical height in the illustrated in FIG. 6. According to one example, the channels have a length-to-width aspect ratio of at least 50. According to another example, the channels are 7 mils or less wide and have a length to width aspect ratio of at least 80. If the aspect ratio is 50 or greater, the channels may be less than about 10 mils wide.

The cooling capacity of the cooling block may also may be controlled by controlling the separation between the cooling fins and the amount of material making up the cooling fins. For example, according to one embodiment, the channels may be separated by fins having a width of 10 mils or less. The fins may be made of the same material as the material that the cooling block is formed from. According to another example, the cooling channels are separated by fins having a width of 7 mils or less.

As is apparent, the dimensions of the cooling channels and fins may be varied, depending upon the desired cooling capacity of the cooling block. Further along these lines, the flow of coolant through the cooling block may be laminar or turbulent depending upon the application. The size and arrangement of the cooling channels may be controlled to affect the characteristics of the flow as well as the cooling capacity.

The channels in the cooling block may be oriented such as they will be parallel to the surface of the component when a component is engaged by the block.

It will be recognized by one skilled in the art of micro-channel heat sink design that the width, height and length of the cooling channels as well as the fin thickness can be varied to proved the desired thermal and fluid flow characteristics. For example, one embodiment of the present invention includes 28 parallel cooling channels each having a width of about 0.01 inch, a height of about 0.08 inch, a length of about 0.67 inch, and a fin thickness of about 0.013 inch. This configuration can utilize about 0.27 gallon per minute of water at a pressure drop of about 2 psi resulting in a copper to water thermal resistance of about 0.15 C/W. This flow is expected to be laminar based on the flow rate.

Alternate geometries will be better suited to other flow rates, operating pressures, types of coolant (liquid or gas) and of coarse the thermal performance.

To control the flow of coolant through the cooling block, the cooling block may include an associated coolant flow manifold. FIGS. 5*b* and 5*c* illustrate perspective views of elements of an embodiment of a cooling block coolant flow manifold according to the present invention. The embodiment of the coolant flow manifold illustrated in FIGS. 5*b* and 5*c* includes two manifold elements 11 and 13. Both manifold elements include passages that direct incoming coolant into the cooling block and cooling channels and outflowing coolant from the cooling block and cooling channels.

The two part coolant flow manifold illustrated in FIGS. 5*b* and 5*c* includes coolant flow conduits 15, 17, and 19. The coolant flow conduits connect to coaxial conduits 23 and 25 also included in the manifold elements illustrated in FIGS. 5*b* and 5*c*. Coaxial conduits 23 and 25 may be interconnected with a coaxial bellows as described below in greater detail.

One of the coolant flow conduits 15 and 17 may introduce coolant into the cooling block 1 and the cooling channels. The other of the coolant flow conduits 15 and 17 may act as a drain passage to drain coolant from the cooling block 1 and the coolant flow channels. In the embodiment illustrated in FIGS. 5*b* and 5*c,* when assembled, coolant will flow between coolant flow conduits 15 and 19. Additionally, coolant will flow between conduits 17 and 23. During operation, coolant will also flow through the cooling block and the cooling channels between conduits 15 and 17. The coolant may flow in either direction through the coolant flow conduits and the cooling block.

Other arrangements of coolant flow conduits are also contemplated. For example there may be multiple inlet and/or outlet conduits. This may have the effect of reducing the effective fluid flow length, thus improving performance due to the developing flow field at the channel inlet effects. One embodiment could include a single inlet conduit in the center of the block and outlets at each end.

The coolant flow manifold elements 11 and 13 may be assembled with cooling block 1. The manifold elements may be soldered to the block. The manifold elements and the block may be considered to be a cooling block assembly.

According to one embodiment, the coolant flow manifold 11 has a substantially U-shaped cross-section, as in the embodiment illustrated in FIG. 5*b,* to receive the cooling block 1. The sides of the U-shape serve to seal the ends of the fluid channels 7 in block 1.

However, it is not necessary that cooling flow manifold element 11 have a U-shaped cross-section. Other methods could be used to seal the ends of the channels or other manufacturing techniques could be employed such that the channels 7 stop short of the edge of block 1. The surface of the coolant flow element may simply engage the surface of the cooling block.

Regardless of how the cooling block 1 and the coolant flow manifold, or manifold elements, engage each other, if the cooling block and the manifold are made of separate elements that are connected together, preferably the connection is tight so as to prevent the flow of coolant through a seam or seams between the cooling block and the coolant flow manifold or manifold element(s). If the coolant flow manifold includes a second manifold element as in the embodiment illustrated in FIGS. 5*b* and 5*c*, the elements 11 and 13 of the coolant flow manifold may be configured similar to the element 11 of the coolant flow manifold and the cooling block, such that at least one of the manifold elements has a U-shaped cross section. However, in the embodiment illustrated in FIGS. 5*b* and 5*c*, the first and second manifold elements 11 and 13 do not have a engaging U-shaped cross-sections. Rather, the surfaces of the coolant flow manifolds meet and are connected to together such that they form a tight connection to prevent the flow of coolant between them.

According to other embodiments of the present invention, the coolant flow manifold may be a single member that does require connection of individual members. The coolant flow manifold may also include more that two manifold members. Similarly, the cooling block and the coolant flow manifold may be a single unitary member.

The coolant may be supplied to and drained from the cooling block and/or the coolant flow manifold through an inlet port for conducting coolant to the cooling block and an outlet port for conducting coolant or draining coolant from the cooling block. In the embodiment illustrated in FIGS. 5*b* and 5*c*, the openings of the coaxial coolant flow chambers 23 and 25 facing away from the other manifold member may be considered to be the inlet port and outlet port. The coolant flow manifold may be provided to direct coolant from the inlet port and outlet port to the cooling block.

Coolant may be supplied to the inlet port and outlet port, and, if part of the system, the coolant flow manifold through a coaxial bellows. FIGS. 2, 3, and 4 illustrate one embodiment of a coaxial bellows 27 according to the present invention. According to the embodiment illustrated in FIGS. 2–4, the coaxial bellows 27 includes an outer bellows 29 and an inner bellows 31. The internal diameter of the inside bellows 31 and the annulus 28 between the inner bellows 31 and the outer bellows 29 provide an independent inlet and outlet for coolant flow. Which of the spaces in the bellows provides an inlet and which provides an outlet may vary depending upon the application.

For some designs there may be a significant difference between inlet and outlet pressure. For example, if the inlet pressure is higher, the inner bellows could be utilized as the inlet to minimize the possibility and/or conswequences of leaks. According to other embodiments, this may be of little concern.

The coaxial bellows not only supplies coolant to the cooling block, but may also provide a degree of compliance to the cooling block. Accordingly, the coaxial bellows may be compliant in the axial direction in 3 dimensions, the axial or Z-axis direction and rotationally, about the X-axis and the Y-axis. This may permit the cooling block to accommodate variations in chip planarity and height relative to the substrate. By connecting the block to the co-axial bellows, the present invention helps to ensure reliable, compliant contact to the component.

To cause coolant to flow through the bellows, coolant flow manifold and cooling block, a pressure differential may be created between the inner bellows and the annulus between the inner bellows and outer bellows. According to one embodiment, the pressure differential may be from about 1 to about 30 pounds per square to inch. According to one embodiment the pressure difference between the inlet and outlet is between about 1 to about 4 pounds per square inch.

The bellows may be connected to the inlet and outlet of the cooling block in a variety of ways. According to an embodiment, both bellows may be welded, brazed, or soldered to the inlet port and the outlet port of the cooling block. A suitable adhesive could also be used if the adhesive can provide a tight connection between the bellows and the cooling block and withstand any conditions that may be created during processes, such as testing and burn-in, that may be carried out on the electronic component while attached or engaged by the cooling block.

The coolant utilized with the present invention may be either a liquid or a gas. According to one embodiment, air is utilized is the coolant. According to another embodiment, water may be employed as the coolant. At the present time, utilizing a liquid as the coolant is the best mode known for operating the present invention.

Among the factors that may be considered in slecting the coolant are the required temperature range, thermal performance, cost, safety, and environmental factors, among other factors. Other factors include concerns about leakage. The size of the cooling channels can be altered and optimized for various coolants. One of ordinary skill in the art, once aware of the present disclosure could select an appropriate coolant without undue experimentation.

The end of the each of the coaxial bellows opposite of the end attached to the inlet port and outlet port of the cooling block or coolant flow manifold may be attached to a second coolant flow manifold 33. The second coolant flow manifold 33 may supply coolant to the coaxial bellows. FIG. 3 illustrates a cross-sectional view of an embodiment of a coolant flow manifold 33.

The embodiment of the second coolant flow manifold 33 illustrated in FIG. 3 includes passages 35 and 37 for supplying coolant to the inner and outer bellows 31 and 29 of the coaxial bellows 27. In the embodiment illustrated in FIG. 3, the inner bellows is supplied by coolant flowing through coolant flow conduit 37. On the other hand, the annulus between the inner bellows and outer bellows is supplied with coolant through coolant flow conduit 35.

Of course, the flow directions and connections may be reversed. Along these lines, FIG. 3 illustrates one arrangement for coolant flow conduits and the second coolant flow manifold 33. However, any arrangement of coolant flow conduits may be utilized in second coolant flow manifold.

The inner and outer bellows may be attached to the second coolant flow manifold 33 utilizing similar means as may be utilized for connecting the inner and outer bellows to the inlet port and outlet port of the cooling block. For example, brazing, welding, soldering and/or one or more adhesives may be utilized to join the second conduit flow manifold and the inner and outer bellows.

In addition to attachment by the means described above, the bellows may be detachably connected to the cooling block as well as the second coolant flow manifold. For example, one or more O-rings and/or clamps could be utilized to attache the bellows. Ease of assembly and/or maintenance may be factors in designing this aspect of the device.

As in the embodiment illustrated in FIGS. 1–4, a system according to the present invention may include a substrate pressure plate 39. Sibstrate pressure plate 39 may permit a system according to the present invention to apply pressure to a substrate 102 thus forcing the substrate against an electrical contact means such as an array of pogo pins (not shown). The required force may be quite high, for example, from about 50 to about 100 pounds or more, because there may be hundreds of contact pads on the bottom of the substrate. It is desirable to limit the force applied to the silicon chip 100, for example, by the thermal control means, to approximately 5 to aproximately 10 pounds to limit the possibility of mechanical damage to the chip. Therefore, it is an object of the present invention to apply independent forces to the substrate and the silicon chip. It will be obvious that other types of electronic packages and sockets may not require an independent forcing means.

The independent application of forces by the present invention is facilitated by the coaxial bellows. Along these lines, the coaxial bellows may provide compliance in the z-axis direction to permit forces to be applied independently to the substrate. In other words, the cooling block, which acts as a heatsink as described above, may be mechanically decoupled from substrate pressing means by the coaxial bellows. At the same time, the bellows may provide an independent sealed inlet and outlet to the cooling block for coolant flow. The coolant pressure drop from the inlet to the outlet of the cooling block, any back pressure applied to the coolant, and/or spring rate of the inside bellows and/or outside bellows may be tailored to provide a desired heat-sink contact force to the device. After applying a desired amount of force to a substrate and an attached electronic component, such as a semiconductor chip, pressure of the coolant can be manipulated to provide an actuation movement of the cooling block.

A system according to the present invention may also include a frame member 41 which mechanically couples the substrate pressing member 39 to a force actuation means (not shown) using bolts 47. The force actuation means may include hinges, latches, levers and/or air cylinders, for example, to align the assembly with the electronic device and socket and to facilitate quick and easy removal of the module from the socket.

Second coolant flow manifold 33 may be attached to member 41 utilizing bolts 45. As can be seen in particular in FIGS. 2 and 3, application of force to member 41 may apply force to the second coolant flow manifold 33 in addition to member 39. However, the coaxial bellows may prevent application of a substantial portion of this force through to the cooling block 1.

Figure 8:
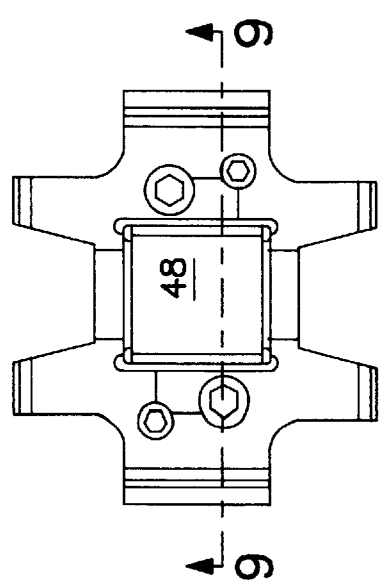
FIG. 8 represents a top view of the embodiment illustrated in FIG. 7.
Figure 9:
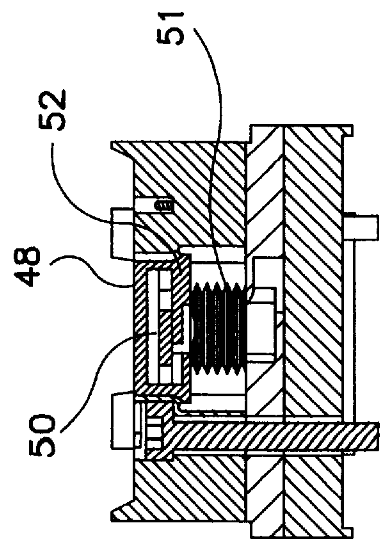
FIG. 9 represents a cross-sectional view of the embodiment of the present invention illustrated in FIG. 8 taken along the line 9—9.

FIGS. 7–9 illustrate an alternative embodiment of a system according to the present invention. FIGS. 7–9 illustrate an embodiment where the substrate forcing means, second manifold and frame member is modified. The system illustrated in FIGS. 7–9 includes cooling block and first coolant flow manifold 49 coaxial bellows 51 including inner bellows 53 and outer bellows 55, two member 57 and 59 second coolant flow manifold, force application and mounting member 61 and connecting bolts 63 and 65.

In testing and processing applications, a device according to the present invention, as illustrated in FIGS. 1–3 and 7–9 may apply two forces to a electronic component and a substrate that the component is mounted on. For example, a first force may be applied to the device to attach the cooling block to an electronic component. A second force may than be applied to press the component onto a device for testing or processing purposes. Application of the first and second forces may be independent. The second force may be utilized for urging the electronic component into an electrical contact with a socket on a testing or processing apparatus.

As is apparent, due to the inclusion of a coaxial compliant bellows, different forces may be applied to a component and a module that the component is attached to so that a device according to the invention may push lightly on the component and heavily on the module. For example, an electronic component may be urged into connection in a module socket or pogo pin array.

Many of these forces may need to be applied to a substrate to help ensure electrical contact to pads of a test or processing device. The present invention is particularly useful for testing and processing C-4 attached chips attached to the top of a ceramic substrate that has balls or pads on the bottom surface.

After establishing desired contact between the device of the invention, an electronic component and/or testing or processing device, coolant may be circulated at least through the cooling block. The testing and/or processing steps may then be carried out on the electronic component. Flow of coolant may be substantially as described above.

Elements of the present invention could be modified in a large number of ways to adapt the present invention to, for example, a wide range of module types and/or socket types, including manual and automated module and module handlers. Other advantages of the present invention include excellent thermal performance independent of the planarity of height of the silicon chip due to the gimbaled nature of the cooling block mounted to bellows. Additionally, the dual bellows design of the present invention permits the design of a cooling block that has a relatively high pressure difference between inlet and outlet for improved thermal performance.

Among the advantages of the present invention are that embodiments of the invention may have a high throughput, low cost, high reliability, cause no damage to a module and/or electronic component, be adaptable to various module types and chip sizes and work with variable known conductors and sockets and/or prevent a module from being contaminated or wetted by coolant. Single bellows, flexible tubing, and O-ring seals known for attaching liquid cooling apparatuses to heatsinks typically suffer from these and other deficiencies. The present invention is particularly useful for keeping module temperature down when power is high.

Other known devices include the use of thermal conduction pistons to conduct heat from the silicon chip into a cold plate. The numerous interfaces of chip to piston, piston to cold plate and cold plate to liquid result in an inadequate cooling capacity for high powered chips.

Flow of coolant through a cooling block such as provided by the present invention, which includes cooling channels, may be much more efficient than devices where a cooling directly impinges upon an electronic component. The use of an independent coolant inlet and outlet according to the present invention may facilitate utilization of the cooling block and cooling channels. Utilization of a coaxial inlet and outlet ports and coolant flow bellows may also make the present invention more compact than known cooling devices. Additionally, rather than having the coolant directly contacting electronic component, sealing problems are avoided. Also avoided are any problems that may be associated with failure of seals and resulting coolant contamination of electronic components. The coaxial bellows, coaxial inlet and outlet ports, and cooling block described above also provide a physically compact device. The physically compactness may be important for use of a device according to the present invention in auto handlers in high volume burn-in applications.

A cooling block in system according to the present invention may be utilized for testing and/or other purposes. For example, a device according to the present invention could be used for burn-in. Furthermore, the present invention could be used at a system level. In such an application, grease could be utilized between the cooling block and the attached electronic component, such as semiconductor chip since at a system level, the cooling block and chip would not be regularly disassembled. However, grease may also be utilized for testing and manufacturing processing applications. However, cleaning the grease may simply complicate use of the testing and processing device somewhat.

Thermal performance of a device according to the present invention can also be improved by adding some other fluid between the cooling block and silicon chip. For example, a drop of water or isopropyl alcohol (IPA) may significantly improve thermal performance and results in minimal cleaning concerns for module test. Yet another way to improve thermal performance of a device according to the present invention is to inject a small flow of a high thermal conductivity gas such as helium or hydrogen into the area surrounding the chip. Any of these improves the thermal coupling between the chip and cooling block.

The invention as described contacts the silicon chip directly but it is obvious it could also be used with other types of electronic modules to contact an appropriate surface such as heat spreader, package cover, heatsink or some other surface of a component and/or package.

The present invention can provide fast, accurate control of the temperature of a device. Temperature control may include heating, cooling, or a combination of the two, depending upon parameters such as initial device temperature, desired temperature, ambient temperature and power dissipated by the device, the latter which may result in self heating. The invention is particularly well suited to testing high power devices that require high performance coolng.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A system for controlling the temperature of an electronic component and for at least one of testing and burning-in the electronic component, the system comprising:

a block for temporarily engaging a surface of the component, the block including channels for circulating a temperature regulating fluid to control the temperature of the block and the attached component; and a socket for making electrical connection to the electronic component for at least one of testing and burning-in of the electronic component.

2. The system according to claim 1, wherein the temperature regulating fluid is a coolant.

3. The system according to claim 1, further comprising:

one or more inlet port and one or more outlet port in the block for conducting the temperature regulating fluid to the block; and an outlet port in the block coaxial with the inlet port for conducting the temperature regulating fluid from the block.

4. The system according to claim 1, further comprising:

a coaxial bellows including an inner bellows and an outer bellows, a first end of the inner bellows being interconnected with one of the inlet port and the outlet port, a first end of the outer bellows being interconnected with another of the inlet port and the outlet port.

5. The system according to claim 4, further comprising:

a first manifold for interconnecting the channels with the inlet port and the outlet port.

6. The system according to claim 4, further comprising:

a second manifold interconnected with a second end of the inner bellows and a second end of the outer bellows for supplying temperature regulating fluid to one of the inner bellows and the outer bellows and draining temperature regulating fluid from another of the inner bellows and the outer bellows.

7. The system according to claim 1, wherein the channels have a high vertical to horizontal aspect ratio to increase an area of contact between the temperature regulating fluid and the block.

8. The system according to claim 1, wherein a vertical to horizontal aspect ratio of the channels is sufficient to produce to increase an area of contact between the temperature regulating fluid and the block.

9. The system according to claim 1, wherein the block is made of copper.

10. The system according to claim 1, wherein the channels oriented such that they will be parallel to the surface of the component when engaged by the block.

11. The system according to claim 1, wherein the temperture regulating fluid flows laminarly through the channels.

12. The system according to claim 1, wherein the temperature regulating fluid flows turbulently through the channels.

13. The system according to claim 1, where the system permits application of force to the component for engagement of the component by the block, independent of a force applied to the component by the system for electrically contacting and testing the component.

14. The system according to claim 6, further comprising:

an inlet port in the block for conducting the temperature regulating fluid to the block;

an outlet port in the block coaxial with the inlet port for conducting the temperature regulating fluid from the block; and a coaxial bellows including an inner bellows and an outer bellows, a first end of the inner bellows being interconnected with one of the inlet port and the outlet port, a first end of the outer bellows being interconnected with another of the inlet port and the outlet port;

wherein the coaxial bellows is compliant in a direction parallel to the application of force to the component by the system and compliant in rotational directions perpendicular to the direction of the application of force.

15. The system according to claim 1, wherein the system permits application of force to the component for contacting and electrically testing the component, independent of a force applied to the component for engagement of the component by the block.

16. The system according to claim 15, further comprising:

least one inlet port in the block for conducting the temperature regulating fluid to the block;

at least one outlet port in the block coaxial with the at least one inlet port for conducting the temperature regulating fluid from the block; and a coaxial bellows including an inner bellows and an outer bellows, a first end of the inner bellows being interconnected with one of the inlet port and the outlet port, a first end of the outer bellows being interconnected with another of the inlet port and the outlet port;

wherein the coaxial bellows is compliant in a direction parallel to the application of force to the component by the system and compliant rotationally.

17. The system according to claim 6, wherein the system permits application of force to the component for contacting and electrically testing the component, independent of a force applied to the component for engagement of the component by the block, wherein the force applied to the component for electrically testing the component is applied by a coaxial member attached to the second manifold.

18. The system according to claim 15, wherein the force applied to the component for electrically testing the component urges the component into electrical contact with a socket.

19. The system according to claim 1, wherein the channels have a width of about 0.01 inch.

20. The system according to claim 1, wherein the channels are separated from each other by about 0.013 inch.

21. The system according to claim 6, wherein the vertical to horizontal aspect ratio is at least 50.

22. The system according to claim 1, wherein the channels are fabricated by wire electro discharge machining.

23. The system according to claim 2, wherein a difference in pressure of the temperature regulating fluid at the inlet port and at the outlet port is about 4 psi.

24. The system according to claim 3, wherein the bellows is connected to the block by a method selected from the group consisting of welding, brazing, and soldering.

25. The system according to claim 3, wherein the bellows is removable connected to the block.

26. The system according to claim 1, wherein the system cools the electronic component during testing or burn-in.

27. A temperature controlling block for temporarily engaging a surface of an electronic component for controlling the temperature of the component and for at least one of testing and burning-in the electronic component, the block comprising:

a component engaging surface;

a plurality of channels for circulating a temperature regulating fluid to regulate the temperature of the block and a component engaged by the block;

an inlet port for conducting temperature regulating fluid into the channels;

an outlet port for conducting temperature regulating fluid from the channels;

a first manifold for conducting temperature regulating fluid to the channels from the inlet port and from the channels to the outlet port; and a socket for making electrical connection to the electronic component for at least one of testing and burning-in of the electronic component.

28. A method of controlling a temperature of electronic components during test or burn-in, the method comprising the steps of:

temporarily engaging an electronic component with a block for temporarily contacting and regulating the temperature of the electronic component and a socket for making electrical connection to the electronic component for at least one of testing and burning-in of the electronic component;

supplying a temperature regulating fluid to the block through an inlet port in the block;

circulating the temperature regulating fluid through channels in the block to regulate the temperature the block and the component attached component;

withdrawing the temperature regulating fluid from the block through an outlet port in the block; conducting at least one of testing and burn-in of the component.

* * * * *

UNITED STATES PATENT AND TRADEMARK OFFICE
CERTIFICATE OF CORRECTION

PATENT NO. : 6,173,760 B1
DATED : January 16, 2001
INVENTOR(S) : David L. Gardell, Krisztion Gaspar, Guy C. Morin It is certified that error appears in the above-identified patent and that said Letters Patent is hereby corrected as shown below:

Column 3,
Line 51, delete "may also".

Column 10, claim 11,
Line 44, please delete "temperture" and insert -- temperature --.

Column 11, claim 16,
Line 9, please delete "least" and insert -- at least --.

Signed and Sealed this

Thirtieth Day of October, 2001

*Attest:*

Nicholas P. Godici

NICHOLAS P. GODICI

*Attesting Officer*

*Acting Director of the United States Patent and Trademark Office*